(12) United States Patent
Boon

(10) Patent No.: US 7,943,422 B2
(45) Date of Patent: May 17, 2011

(54) WAFER LEVEL PRE-PACKAGED FLIP CHIP

(75) Inventor: Suan Jeung Boon, Singapore (SG)

(73) Assignee: Micron Technology, Inc., Boise, ID (US)

( * ) Notice: Subject to any disclaimer, the term of this patent is extended or adjusted under 35 U.S.C. 154(b) by 199 days.

(21) Appl. No.: 11/460,089

(22) Filed: Jul. 26, 2006

(65) Prior Publication Data

US 2006/0258052 A1    Nov. 16, 2006

Related U.S. Application Data

(62) Division of application No. 10/722,838, filed on Nov. 26, 2003, now abandoned, which is a division of application No. 09/505,018, filed on Feb. 16, 2000, now Pat. No. 6,710,454.

(51) Int. Cl.
*H01L 21/00* (2006.01)
*H01L 21/44* (2006.01)
(52) U.S. Cl. .................. 438/108; 438/109; 438/598
(58) Field of Classification Search .................. 438/108, 438/109, 598
See application file for complete search history.

(56) References Cited

U.S. PATENT DOCUMENTS

| | | |
|---|---|---|
| 3,040,119 A | 6/1962 | Granzow |
| 3,320,658 A | 5/1967 | Bolda et al. |
| 3,396,894 A | 8/1968 | Ellis |
| 3,472,365 A | 10/1969 | Tiedema |
| 3,535,769 A | 10/1970 | Goldschmied |
| 3,719,981 A | 3/1973 | Steitz |
| 3,744,129 A | 7/1973 | Dewey, Jr. |
| 3,750,265 A | 8/1973 | Cushman |
| 3,982,320 A | 9/1976 | Buchoff et al. |
| 4,099,615 A | 7/1978 | Lemke et al. |
| 4,142,286 A | 3/1979 | Knuth et al. |
| 4,209,893 A | 7/1980 | Dyce et al. |
| 4,216,350 A | 8/1980 | Reid |
| 4,664,309 A | 5/1987 | Allen et al. |
| 4,705,205 A | 11/1987 | Allen et al. |
| 4,712,721 A | 12/1987 | Noel et al. |

(Continued)

FOREIGN PATENT DOCUMENTS

JP    362174951    *    7/1987

(Continued)

OTHER PUBLICATIONS

"Shin-Etsu Connectors—AF Type", *Shin-Etsu*, http://www.shinetsupolymer.com/aftype.htm,(1997),p. 1. "Shin-Etsu Connectors—GB-Matrix Type", *Shin-Etsu*, http://www.shinetsupolymer.com/gbmtype.htm, (1997), pp. 1-2.
Lau, J. H., *Ball Grid Array Technology*, ISBN 0-07-036608-X,(1995),pp. 132, 133, 188-192.

*Primary Examiner* — Matthew C Landau
*Assistant Examiner* — James M Mitchell
(74) *Attorney, Agent, or Firm* — Schwegman, Lundberg & Woessner, P.A.

(57) ABSTRACT

Methods for producing a flip chip package by prepackaging one or more dice on a semiconductor wafer are provided. An embodiment of the method includes applying an adhesive to a first side of a finished wafer, where a number of dice are located. The active layer of the dice is on the first side of the finished wafer. The method further includes forming an array of conductive elements within the adhesive, where the array of conductive elements is electrically coupled to an array of connection pads on a die. The wafer can be diced to provide pre-packaged chips. To provide greater mounting densities, two or more dice may be coupled before application of the adhesive layer.

51 Claims, 11 Drawing Sheets

U.S. PATENT DOCUMENTS

| | | | |
|---|---|---|---|
| 4,897,708 A * | 1/1990 | Clements | 257/690 |
| 4,903,889 A | 2/1990 | Svendsen et al. | |
| 4,954,875 A * | 9/1990 | Clements | 257/686 |
| 5,001,542 A | 3/1991 | Tsukagoshi et al. | |
| 5,126,210 A | 6/1992 | Wieserman et al. | |
| 5,219,117 A | 6/1993 | Lin | |
| 5,229,647 A * | 7/1993 | Gnadinger | 257/785 |
| 5,347,428 A | 9/1994 | Carson et al. | |
| 5,432,999 A * | 7/1995 | Capps et al. | 438/109 |
| 5,442,852 A | 8/1995 | Danner | |
| 5,468,681 A | 11/1995 | Pasch | |
| 5,477,160 A | 12/1995 | Love | |
| 5,483,174 A | 1/1996 | Hembree et al. | |
| 5,498,902 A * | 3/1996 | Hara | 257/686 |
| 5,523,628 A | 6/1996 | Williams et al. | |
| 5,528,080 A | 6/1996 | Goldstein | |
| 5,658,827 A | 8/1997 | Aulicino et al. | |
| 5,674,785 A | 10/1997 | Akram et al. | |
| 5,675,180 A * | 10/1997 | Pedersen et al. | 257/685 |
| 5,685,885 A | 11/1997 | Khandros et al. | |
| 5,696,031 A | 12/1997 | Wark | |
| 5,713,744 A | 2/1998 | Laub | |
| 5,716,222 A | 2/1998 | Murphy | |
| 5,726,493 A * | 3/1998 | Yamashita et al. | 257/698 |
| 5,736,456 A | 4/1998 | Akram | |
| 5,739,585 A | 4/1998 | Akram et al. | |
| 5,747,101 A * | 5/1998 | Booth et al. | 438/460 |
| 5,789,271 A | 8/1998 | Akram | |
| 5,808,360 A | 9/1998 | Akram | |
| 5,808,874 A | 9/1998 | Smith | |
| 5,811,879 A | 9/1998 | Akram | |
| 5,817,540 A | 10/1998 | Wark | |
| 5,819,406 A | 10/1998 | Yoshizawa et al. | |
| 5,821,624 A | 10/1998 | Pasch | |
| 5,825,195 A | 10/1998 | Hembree et al. | |
| 5,834,339 A | 11/1998 | Distefano et al. | |
| 5,834,366 A | 11/1998 | Akram | |
| 5,844,315 A * | 12/1998 | Melton et al. | 257/738 |
| 5,849,608 A | 12/1998 | Abe | |
| 5,851,845 A | 12/1998 | Wood et al. | |
| 5,851,911 A | 12/1998 | Farnworth | |
| 5,861,323 A | 1/1999 | Hayes | |
| 5,866,951 A | 2/1999 | Gademann et al. | |
| 5,891,753 A | 4/1999 | Akram | |
| 5,897,337 A | 4/1999 | Kata et al. | |
| 5,898,224 A | 4/1999 | Akram | |
| 5,898,858 A | 4/1999 | Gillespie | |
| 5,903,058 A | 5/1999 | Akram | |
| 5,917,242 A | 6/1999 | Ball | |
| 5,929,482 A | 7/1999 | Kawakami et al. | |
| 5,933,713 A * | 8/1999 | Farnworth | 438/127 |
| 5,936,305 A | 8/1999 | Akram | |
| 5,956,605 A | 9/1999 | Akram et al. | |
| 5,973,396 A | 10/1999 | Farnworth | |
| 5,973,403 A | 10/1999 | Wark | |
| 5,982,018 A | 11/1999 | Wark et al. | |
| 5,994,166 A | 11/1999 | Akram et al. | |
| 5,994,753 A | 11/1999 | Nitta | |
| 6,001,724 A | 12/1999 | Stansbury | |
| 6,013,944 A | 1/2000 | Moriya et al. | |
| 6,022,758 A | 2/2000 | Badehi | |
| 6,049,124 A | 4/2000 | Raiser et al. | |
| 6,051,878 A | 4/2000 | Akram et al. | |
| 6,054,337 A * | 4/2000 | Solberg | 438/107 |
| 6,060,769 A | 5/2000 | Wark | |
| 6,063,646 A | 5/2000 | Okuno et al. | |
| 6,071,754 A | 6/2000 | Wark | |
| 6,072,236 A | 6/2000 | Akram et al. | |
| 6,078,100 A | 6/2000 | Duesman et al. | |
| 6,080,264 A | 6/2000 | Ball | |
| 6,081,997 A | 7/2000 | Chia et al. | |
| 6,083,820 A | 7/2000 | Farnworth | |
| 6,084,297 A | 7/2000 | Brooks et al. | |
| 6,103,552 A | 8/2000 | Lin | |
| 6,121,689 A | 9/2000 | Capote et al. | |
| 6,133,639 A | 10/2000 | Kovac et al. | |
| 6,147,401 A | 11/2000 | Solberg | |
| 6,148,512 A * | 11/2000 | Brown | 29/837 |
| 6,153,505 A | 11/2000 | Bolde et al. | |
| 6,159,837 A | 12/2000 | Yamaji et al. | |
| 6,169,328 B1 | 1/2001 | Mitchell | |
| 6,177,296 B1 | 1/2001 | Vindasius et al. | |
| 6,181,010 B1 | 1/2001 | Nozawa | |
| 6,187,615 B1 | 2/2001 | Kim et al. | |
| 6,190,940 B1 * | 2/2001 | DeFelice et al. | 438/106 |
| 6,201,301 B1 | 3/2001 | Hoang | |
| 6,219,723 B1 | 4/2001 | Hetherington et al. | |
| 6,222,259 B1 | 4/2001 | Park et al. | |
| 6,222,678 B1 | 4/2001 | Kimura et al. | |
| 6,228,678 B1 | 5/2001 | Gilleo et al. | |
| 6,228,681 B1 | 5/2001 | Gilleo et al. | |
| 6,229,209 B1 | 5/2001 | Nakamura et al. | |
| 6,239,367 B1 | 5/2001 | Hsuan et al. | |
| 6,245,595 B1 | 6/2001 | Nguyen et al. | |
| 6,258,627 B1 | 7/2001 | Benenati et al. | |
| 6,260,264 B1 | 7/2001 | Chen et al. | |
| 6,265,776 B1 | 7/2001 | Gilleo | |
| 6,270,363 B1 | 8/2001 | Brofman et al. | |
| 6,287,893 B1 | 9/2001 | Elenius et al. | |
| 6,300,673 B1 | 10/2001 | Hoffman et al. | |
| 6,303,680 B1 | 10/2001 | Neiss | |
| 6,306,680 B1 | 10/2001 | Fillion et al. | |
| 6,313,522 B1 | 11/2001 | Akram et al. | |
| 6,313,528 B1 | 11/2001 | Solberg | |
| 6,335,571 B1 | 1/2002 | Capote et al. | |
| 6,337,257 B1 | 1/2002 | Toyosawa | |
| 6,348,728 B1 * | 2/2002 | Aiba et al. | 257/678 |
| 6,350,664 B1 | 2/2002 | Haji et al. | |
| 6,352,881 B1 | 3/2002 | Nguyen et al. | |
| 6,376,916 B1 | 4/2002 | Hosono et al. | |
| 6,399,178 B1 | 6/2002 | Chung | |
| 6,441,487 B2 | 8/2002 | Elenius et al. | |
| 6,458,622 B1 | 10/2002 | Keser et al. | |
| 6,492,200 B1 | 12/2002 | Park et al. | |
| 6,495,916 B1 * | 12/2002 | Ohuchi et al. | 257/737 |
| 6,498,387 B1 | 12/2002 | Yang | |
| 6,528,349 B1 | 3/2003 | Patel et al. | |
| 6,539,624 B1 | 4/2003 | Kung et al. | |
| 6,555,764 B1 | 4/2003 | Maruyama et al. | |
| 6,590,279 B1 | 7/2003 | Huang et al. | |
| 6,605,525 B2 | 8/2003 | Lu et al. | |
| 6,613,606 B1 | 9/2003 | Lee | |
| 6,639,303 B2 * | 10/2003 | Siniaguine | 257/621 |
| 6,707,100 B2 | 3/2004 | Gajda | |
| 6,710,454 B1 | 3/2004 | Boon | |
| 6,734,534 B1 | 5/2004 | Vu et al. | |
| 6,740,964 B2 * | 5/2004 | Sasaki | 257/687 |
| 6,812,066 B2 * | 11/2004 | Taniguchi et al. | 438/121 |
| 6,903,451 B1 | 6/2005 | Kim et al. | |
| 6,940,160 B1 | 9/2005 | Hanaoka et al. | |
| 6,982,475 B1 | 1/2006 | MacIntyre | |
| 7,084,513 B2 * | 8/2006 | Matsuki et al. | 257/777 |
| 7,405,485 B2 * | 7/2008 | Tanida et al. | 257/777 |
| 7,646,102 B2 | 1/2010 | Boon et al. | |
| 7,808,112 B2 | 10/2010 | Boon | |
| 7,812,447 B2 | 10/2010 | Boon | |
| 2002/0022301 A1 | 2/2002 | Kwon et al. | |
| 2002/0063311 A1 * | 5/2002 | Siniaguine | 257/621 |
| 2002/0109228 A1 | 8/2002 | Buchwalter et al. | |
| 2002/0167085 A1 | 11/2002 | Ohuchi et al. | |
| 2003/0071352 A1 | 4/2003 | Ohuchi et al. | |
| 2004/0140533 A1 | 7/2004 | Stern | |
| 2004/0154164 A1 | 8/2004 | Kang | |
| 2004/0219717 A1 * | 11/2004 | Takahashi et al. | 438/108 |
| 2005/0173809 A1 | 8/2005 | Yamamoto et al. | |
| 2006/0255475 A1 | 11/2006 | Boon | |
| 2006/0261475 A1 | 11/2006 | Boon | |
| 2006/0261493 A1 | 11/2006 | Boon | |
| 2008/0157316 A1 | 7/2008 | Yang | |

FOREIGN PATENT DOCUMENTS

| | | |
|---|---|---|
| JP | 09-045726 | 2/1997 |

* cited by examiner

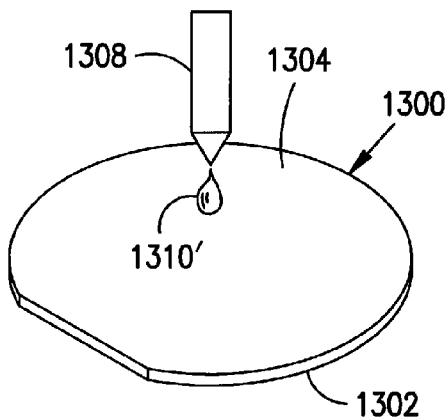
FIG. 13A
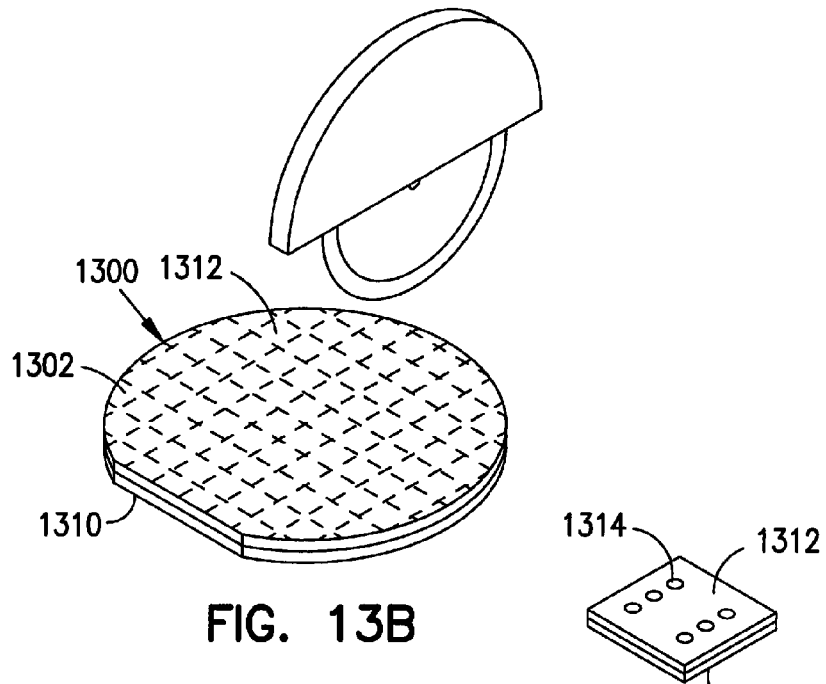
FIG. 13B
FIG. 13C
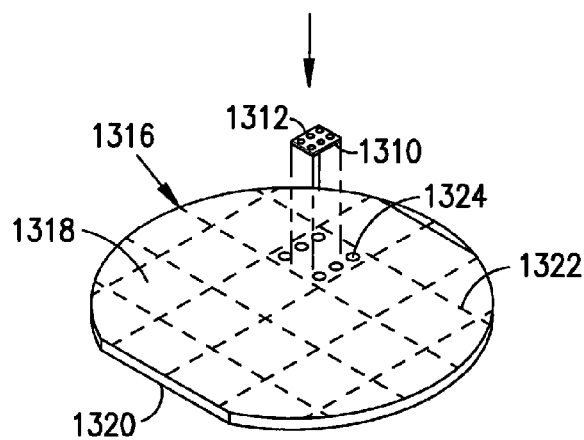
FIG. 13D

WAFER LEVEL PRE-PACKAGED FLIP CHIP

RELATED APPLICATIONS

This application is a Divisional of U.S. application Ser. No. 10/722,838, filed Nov. 26, 2003, now abandoned which is a Divisional of U.S. application Ser. No. 09/505,018, filed Feb. 16, 2000, now issued as U.S. Pat. No. 6,710,454, which are incorporated herein by reference.

TECHNICAL FIELD

This invention relates generally to packaging of semiconductor devices and, more specifically, to an improved flip chip package and method of pre-packaging a flip chip.

BACKGROUND OF THE INVENTION

As demand for smaller, more powerful electronic devices grows, semiconductor manufacturers are constantly attempting to reduce the size and cost of not only semiconductor devices themselves but also semiconductor packaging. Smaller packages equate with higher semiconductor mounting densities and higher mounting densities allow for more compact and yet more capable devices.

With conventional packaging methods, a semiconductor die or "chip" is singulated from the silicon wafer and is encapsulated in a ceramic or plastic package having a number of electrical leads extending therefrom. The leads permit electrical connection between external components and the circuits on the die. Although these packages have proven reliable, they are generally many times larger than the actual die. In addition, the configuration of these packages typically yields only a limited number of leads. For these reasons, conventional packaging techniques are not particularly adaptable to high density packaging.

Accordingly, more efficient chip packages have been developed. One such package is the "pin grid array" or PGA which utilizes a series of pin conductors extending from the face of the package. While PGAs provide increased electrical interconnection density, the pins forming the PGA are fragile and easily bent. In addition, the PGA is relatively expensive to produce and of limited value when the package is to be permanently mounted.

Similar to the PGA are various flip chip packages including the "ball grid array" or BGA. Instead of pins, the BGA has an array of solder bumps or balls attached to the active face of the package in a process called "bumping." The array of solder bumps is adapted to mate with discreet contacts on a receiving component. The package may be subsequently heated to partially liquefy or "reflow" the bumps, thus forming electrical connections at the discreet locations. This technology is frequently referred to as "flip chip" because the solder balls are typically secured to the semiconductor package wherein the package is then "flipped" to secure it to the receiving component. The present invention is directed primarily to flip chip packaging technology and the remainder of this discussion will focus on the same.

While flip chip processes have proven effective, problems remain. For instance, conventional flip chip technology requires an underfill layer between the semiconductor package and the receiving substrate. The underfill material reduces stress on the solder bumps caused by thermal mismatch between the semiconductor package and substrate. The underfill layer further provides insulation between the device and substrate and prevents creep flow at the solder interface. Without the underfill layer, repeated thermal cycling constantly stresses the solder interconnections, potentially leading to failure.

Unfortunately, the underfill process is time consuming and expensive. For example, the equipment used to dispense the underfill must precisely maintain the viscosity of the material, dispensing it at a particular flow rate and within a predetermined temperature range. Further, the underfill process cannot be applied until the package is secured to its receiving substrate. Accordingly, the chip package and substrate design must permit the dispensing equipment direct access to the package/substrate interface. And still further, since the underfill material is distributed via capillary action, the time required to complete the underfill operation can be significant.

One method which avoids the use of underfill material involves the use of a resilient retaining member which supports a series of solder preforms therein. The retaining member is sandwiched between conductive elements such that the preforms effect electrical connection therebetween. Like underfill, however, the retaining member/solder preform is only utilized during actual surface mounting of individual chips.

While underfill processes as well as retaining member/preforms are more than adequate in many applications, current trends in IC fabrication favor completing more and more process steps—many of which would not normally occur until after die singulation—at the wafer level. Wafer level processing is advantageous over conventional methods as it allows multiple ICs (equal to the number of die on the wafer face) to be processed simultaneously rather than serially as typically required after die singulation. Accordingly, the time required to produce a given IC device can be dramatically reduced.

While some processes lend themselves to wafer level processing, known packaging methods such as underfill and retaining member/preform methods unfortunately do not. Thus, what is needed is a flip chip package that can be assembled at wafer level. What is further needed is a package that avoids the problems with underfill materials including troublesome dispensing and assembly cycle times. The present invention is directed to a package and method that addresses these issues.

BRIEF DESCRIPTION OF THE DRAWINGS

FIGS. 13A-13K illustrate wafers at various processing stages according to another embodiment (some section lines removed for clarity)

DETAILED DESCRIPTION OF THE EMBODIMENTS

Figure 1:
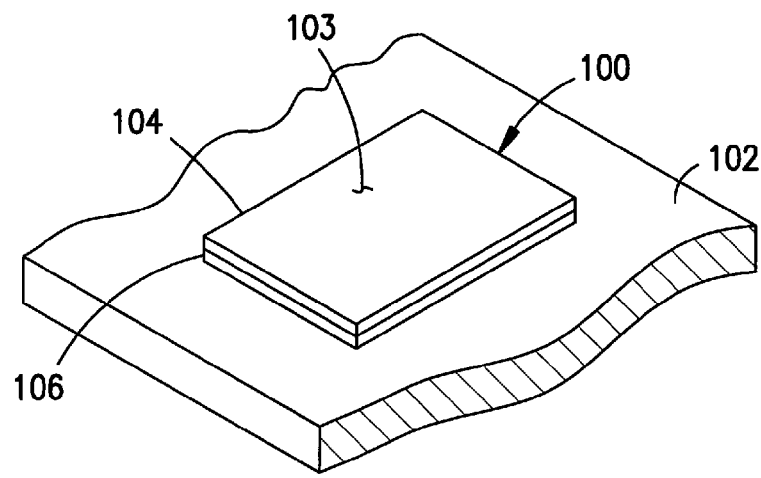
FIG. 1 is a perspective view of a pre-packaged flip chip in accordance with one embodiment, the chip shown attached to a substrate.

In the following detailed description of the preferred embodiments, reference is made to the accompanying drawings which form a part hereof, and in which is shown by way of illustration specific embodiments in which the inventions may be practiced. These embodiments are described in sufficient detail to enable those skilled in the art to practice the invention, and it is to be understood that other embodiments may be utilized and that process, electrical or mechanical changes may be made without departing from the scope of the present invention.

The terms wafer and substrate used in the following description include any base semiconductor structure. Both are to be understood as including silicon-on-sapphire (SOS) technology, silicon-on-insulator (SOI) technology, thin film transistor (TFT) technology, doped and undoped semiconductors, epitaxial layers of a silicon supported by a base semiconductor structure, as well as other semiconductor structures well known to one skilled in the art. Furthermore, when reference is made to a wafer or substrate in the following description, previous process steps may have been utilized to form regions/junctions in the base semiconductor structure, and terms wafer or substrate include the underlying layers containing such regions/junctions. The following detailed description is, therefore, not to be taken in a limiting sense, and the scope of the present invention is defined only by the appended claims and their equivalents.

Broadly speaking, the instant invention is directed to a "pre-packaged" flip chip integrated circuit (IC) device and method for producing the same. Unlike conventional flip chip packages, the pre-packaged IC described herein eliminates the need for underfill operations by forming a flip chip adhesive layer on the package prior to surface mounting. To maximize throughput, the adhesive layer is, in one embodiment, applied at the wafer level. In this way, multiple dice (as many as the wafer provides) can be processed substantially simultaneously. Further, by packaging the die at wafer level, the bare die is handled less often than with conventional packaging operations, thus reducing the opportunity for damage.

Once the adhesive layer is applied, it is processed to produce one or more holes or openings therethrough. In one embodiment, the openings are produced by exposing and patterning a selected photoresist layer and then chemically etching exposed portions of the adhesive layer to produce the openings. However, other methods of creating the openings are also contemplated.

The function of the openings is to provide access to connection pads on the face of the IC device. An electrically conductive material is then deposited into the openings in accordance with various methods as further discussed below. The pre-packaged flip chip is then ready for surface mounting to a receiving component which, for simplicity, will hereinafter be referred to as a support. Examples of a support would include a die attach area of a printed circuit board (PCB) or other device. The electrically conductive material is then re-flowed to interconnect the circuits on the IC to conductors on the support.

By prepackaging the flip chip, messy, expensive, and time-consuming underfill operations are avoided. In addition, by utilizing various embodiments of the invention, the die may be packaged at wafer level, allowing greater manufacturing efficiencies including simultaneous packaging of multiple dice. Furthermore, as described below, the invention lends itself to multi-chip configurations, permitting packages having even greater mounting densities.

With this brief introduction, specific embodiments of the instant invention will now be described. Although the description focuses on particular embodiments, the reader is reminded that such embodiments are exemplary only and are therefore intended merely to teach one of skill in the art how to make and use the invention. Other embodiments are certainly possible without departing from the scope of the invention.

Figure 2:
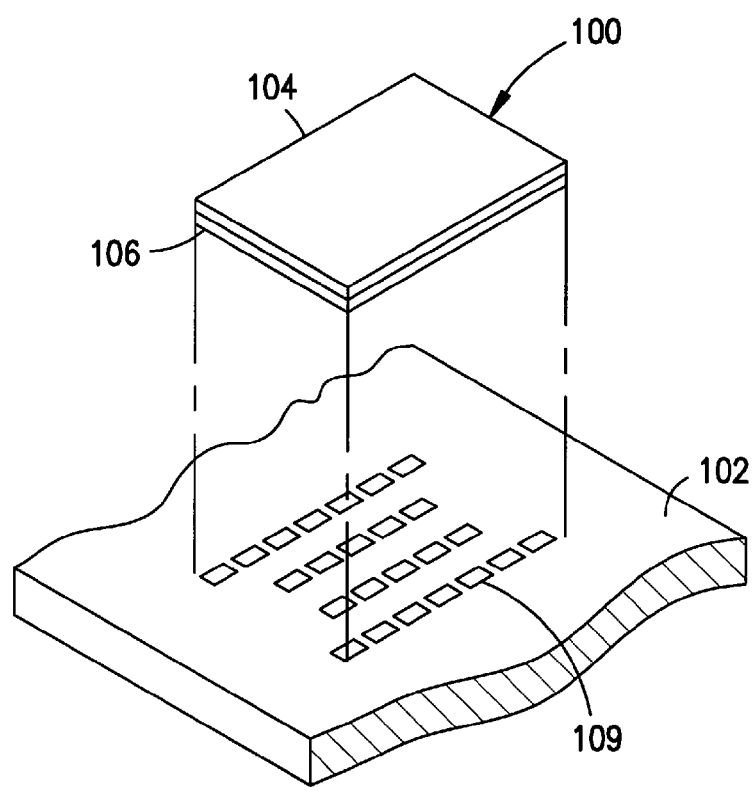
FIG. 2 is an exploded perspective view of the flip chip of FIG. 1.
Figure 3:
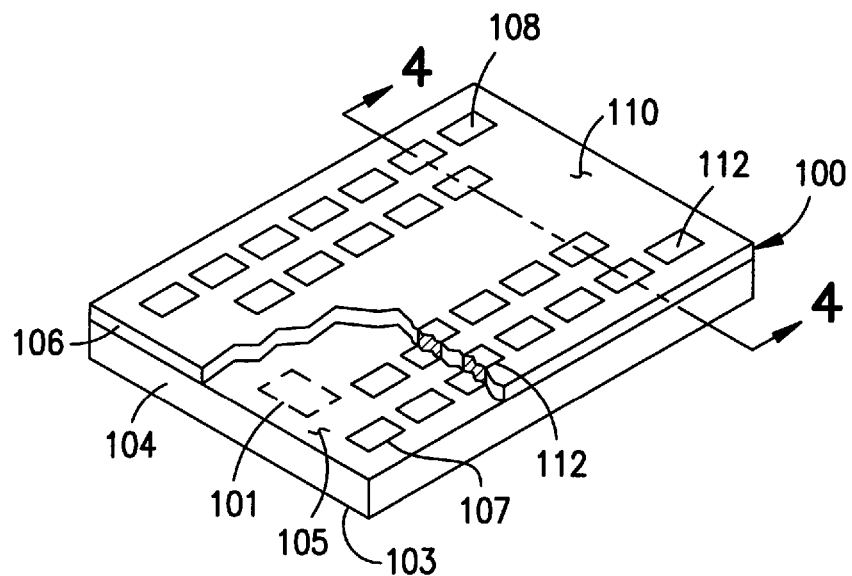
FIG. 3 is a partial cut-away perspective view of an active side of a pre-packaged flip chip in accordance with one embodiment (some section lines removed for clarity)

FIGS. 1-3 show an electronic apparatus such as an IC package 100 according to one embodiment of the invention. The terms "IC package" and "pre-packaged flip chip" are used throughout the specification to refer to an IC device with its protective package and lead system that allows surface mounting of the device to other electronic components such as a receiving support 102. In the context of chip scale devices (CSD), the IC device will hereinafter be described as a semiconductor device such as a chip or die 104 having a first or active side 105 (see FIG. 3) and a second or back side 103. The active side 105 has an array of electrical connection points or "pads" 107 (see FIG. 3) which allow electrical coupling to the electronic circuits 101 on the die 104. The pads are coupled directly to the circuits or, alternatively, coupled to redistribution traces formed in the die 104 which themselves then connect to the circuits. The pads 107 operatively couple to an array of mating conductors 109 on the support 102 (see FIG. 2) via conductive elements 112 (see FIG. 3) as further discussed below.

FIG. 1 shows a flip chip adhesive layer 106 between the die 104 and the support 102. The adhesive layer insulates the conductive elements and prevents damage caused by repeated thermal cycling. For clarity, the adhesive layer 106 is partially removed in FIG. 3 to illustrate the pads 107 on the die surface 105. The adhesive layer 106 bonds or otherwise adheres to the die surface 105 to form the package 100.

One exemplary embodiment of the pre-packaged flip chip 100 is shown in FIG. 3. Here the die 104 is shown with the adhesive layer 106 attached to form the package 100. To provide electrical interconnection to the pads 107 on the die, the adhesive layer 106 includes an array of holes or openings 108 which are substantially aligned with the pads 107 (note that while the holes 108 are shown as rectangular, other shapes are equally within the scope of the invention). That is, when the adhesive layer 106 is attached, the pads 107 are accessible through the openings 108. The adhesive layer further defines a support mating surface 110 which is adapted to adhere to the support 102 (see FIG. 2) as further described below.

The adhesive layer 106 is, in one embodiment, an elastomer applied in fluid form (i.e., applied "wet") where the fluid is subsequently hardened or cured, or alternatively, in tape-like or film form (i.e., applied "dry"). In one embodiment, the adhesive layer comprises a thermoplastic material that repeatedly becomes sticky under application of heat. In this case, the transition temperature of the thermoplastic material is selected to ensure the material does not soften during solder reflow or other subsequent processing. In another embodiment, the adhesive layer is a thermoset material that permanently sets after initial curing. Alternatively, the thermoset material is a "B-stageable" material (i.e., having an intermediate stage in which the material remains wholly or partially plastic and fusible so that it softens when heated).

In still yet another embodiment, the adhesive layer is a pressure-sensitive film that adheres upon contact or under slight application of pressure.

The material used to form the adhesive layer 106 is selected to adequately protect the flip chip package 100 and the support 102 as the two components experience differential expansion during thermal cycling. In one embodiment, the layer is selected to provide a high modulus, effectively fastening the package 100 to the support 102 and significantly prohibiting relative expansion. In another embodiment, the layer 106 is selected to provide a low modulus to allow the package 102 to expand at a different rate than the support without overstressing either the support 102 or the package 100.

To form the openings 108, various methods are used. For example, where the adhesive layer 106 comprises a film, the openings 108 are formed therein by photo-chemical etching, laser cutting, die cutting, or other techniques. One advantage to the film-type adhesive layer 106 is that the openings 108 may be formed, if desired, prior to assembly with the die 104. By then precisely locating the adhesive layer 106 in registration with the die 104, the pre-cut openings 108 are properly aligned with the pads 107 on the die surface 105.

Alternatively, the openings 108 are formed in the adhesive layer 106 after assembly to the die 104. This method lends itself to use with either the film-type adhesive or the wet adhesive. With post-formation of the openings 108, the material used to form the adhesive layer 106 is selected so that the openings 108 can be formed using standard photolithographic techniques.

Still referring to FIG. 3, each opening 108 has a conductive material therein which allows electrical connection through the adhesive layer 106 to the pads 107 on the die surface 105. For simplicity, the conductive material is hereinafter referred to as solder element 112. However, those skilled in the art will realize that a variety of conductive materials (e.g., lead-based and lead-free solders, conductive polymers, conductive pastes, etc.) is usable without departing from the scope of the invention.

Figure 4:
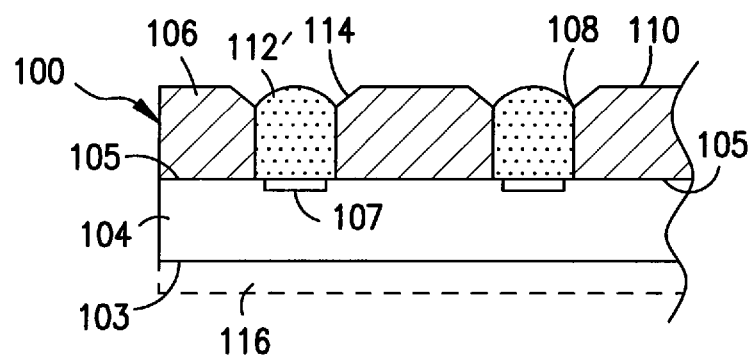
FIG. 4 is section view taken along line 4-4 of FIG. 3 illustrating one embodiment (some section lines removed for clarity)

The solder elements 112, as described below, take various forms including cylindrical or column-shaped structures 112' (see FIGS. 4-6) and sphere-shaped or ball-like structures 112" (see FIG. 7). FIG. 4 shows one embodiment of the solder element 112 wherein the element forms a solder column 112' that is slightly recessed from the mating surface 110. In this particular embodiment, the adhesive layer 106 includes a chamfer 114 in the vicinity of the opening 108. The chamfer 114 and recessed column 112' are particularly advantageous for surface mounting methods which utilize solder paste or flux on the receiving support 102 (see FIG. 2). When the package 100 is surface mounted, any excess paste/flux is accommodated by the void defined by the chamfer 114 and recessed column 112' rather than spreading across the surface 110 where it can interfere with adhesion of the surface 110 to the support 102 (see FIG. 2).

FIG. 4 further illustrates an optional protective coating 116 applied to the back side 103 of the die 104. The coating 116 may be an epoxy or other similar material that hardens to protect the back side 103 which would otherwise be exposed after surface mounting as shown in FIG. 1. Additionally, the coating 116 may a single- or multi-layer material, e.g., an adhesive or adhesive-coated film, that is mounted or laminated to the back side 103 of the die 104.

Other embodiments are also possible. For example, in FIG. 5, the conductive material once again forms a solder column 112'. However, in this particular embodiment, the column 112' has a generally convex-shaped head 118 that extends beyond or protrudes from the surface 110. The solder column 112' is heated sufficiently to become gel-like during surface mounting. When the package is brought into registration with the support 102 (see FIG. 2), the heads 118 wet the support conductors 109 (see FIG. 2) while the surface 110 bonds to the support 102 (see FIG. 2).

Figure 6:
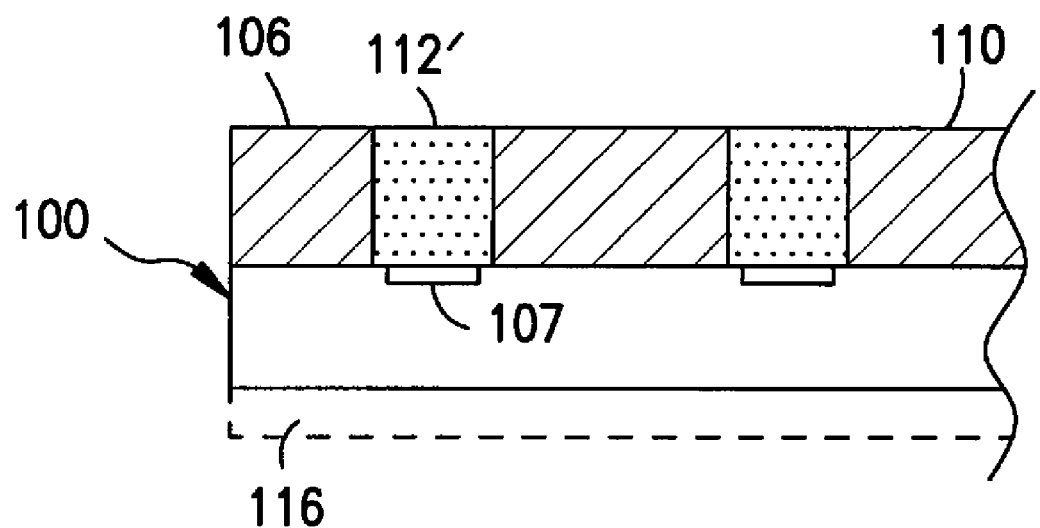
FIG. 6 is another section view taken along line 4-4 of FIG. 3 illustrating yet another embodiment (some section lines removed for clarity)

In still another embodiment such as that shown in FIG. 6, the solder columns 112' are substantially flush with the surface 110. This particular configuration is advantageous when utilizing a pressure sensitive adhesive layer 106 (i.e., an adhesive layer 106 that comprises a flexible tape which adheres to the support under application of pressure). Because, the solder columns 112' are flush to the surface 110, the adhesive layer 106 makes consistent, uniform contact with the support 102 (see FIG. 2). Once secured to the support 102, the package is heated to reflow the columns 112' and form the required electrical interconnection.

The solder columns 112' are advantageous as the column height can be adjusted to correspond to the desired adhesive layer 106 thickness. Further, the columns are able to deflect and twist to accommodate relative motion between the die 104 and the support 102.

Figure 7:
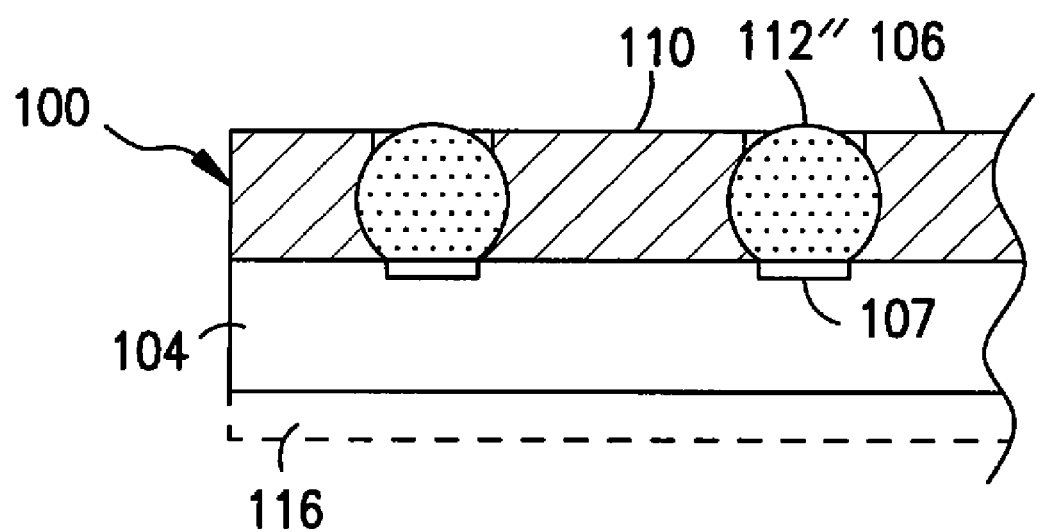
FIG. 7 is another section view taken along line 4-4 of FIG. 3 illustrating still yet another embodiment (some section lines removed for clarity)

While the above-described embodiments utilize solder columns 112', still yet another embodiment utilizes solder balls 112" as generally shown in FIG. 7. Like the embodiments described in FIGS. 4-6, the solder balls 112" can be recessed within the surface 110, protrude therefrom, or be relatively flush thereto. The solder balls 112" are advantageous in that they are cost-efficient to produce and capable of being handled by most semiconductor processing machines. While not shown herein, the solder columns 112' are, in one embodiment, formed by stacked solder balls 112".

Having described various exemplary embodiments of the pre-packaged flip chip 100, a method for producing the package will now be described in accordance with one exemplary embodiment. In describing the method, only those processes necessary for one of ordinary skill in the art to understand the invention are described in detail. Other fabrication processes that are well known or are unnecessary for a complete understanding of the invention are excluded.

As mentioned above, various embodiments of the invention are perceived to be particularly advantageous for pre-packaging dice at wafer level. Generally speaking, the method, according to one embodiment, comprises applying an adhesive layer to an entire side of a semiconductor wafer (see generally FIG. 8C) wherein the wafer comprises numerous dice thereon. As described above, the adhesive layer either includes or is modifiable to include openings having conductive elements therein. The adhesive layer adheres to each die on the wafer such that a conductive element is aligned and in contact with each pad on each die. The die is then singulated from the wafer to produce a pre-package flip chip 100 as shown in FIG. 3 and discussed above.

Figure 8A:
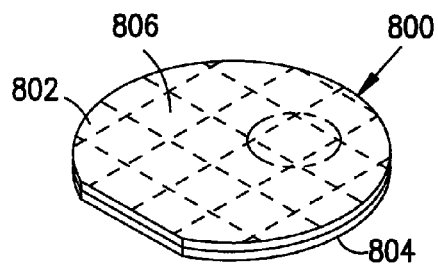
FIGS. 8A-8I illustrate wafers at various processing stages according to one embodiment.
Figure 8B:
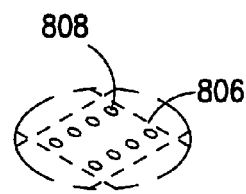

With this general introduction, an exemplary method of making the pre-packaged flip chip in accordance is now described with reference to FIGS. 8A-8I. FIG. 8A shows a finished wafer 800 (i.e., a wafer that has substantially completed all fabrication processes) having a first or active side or face 802 and a second or back side 804. Located on the wafer 800 is an array of dice 806. Each die 806 has an array of conductive pads 808 as shown in FIG. 8B. The pads 808 permit electrical connection to circuits on each die 806.

Figure 8C:
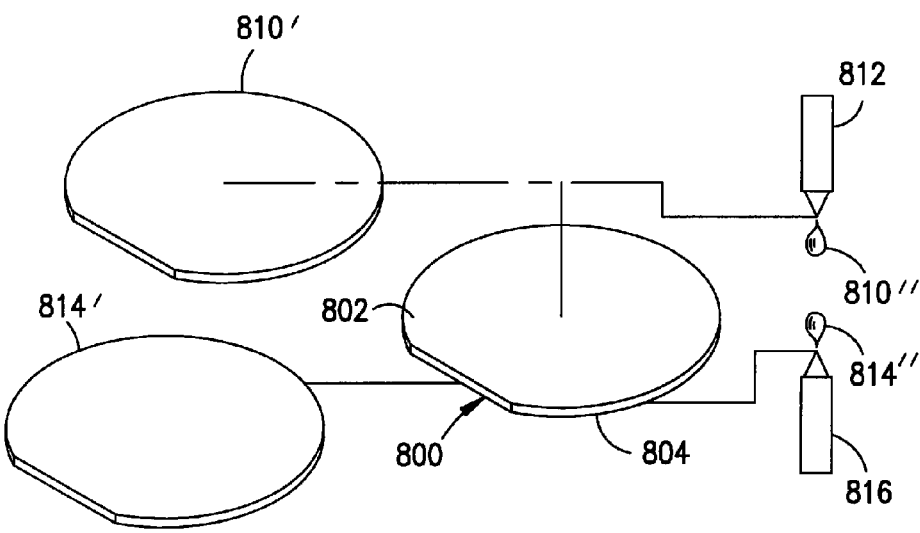
Figure 8D:
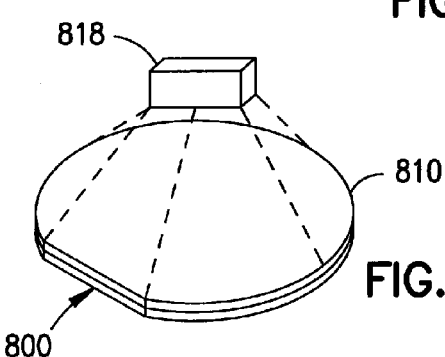

FIG. 8C illustrates an adhesive layer 810 placed over the active side 802 of the wafer 800. In one embodiment, the adhesive layer 810 comprises an adhesive film 810' that bonds to the wafer 800. In another embodiment, the adhesive layer 810 comprises a fluid 810" applied wet via a dispensing apparatus 812 and evenly distributed over the first side 802. The fluid 810", in one embodiment, forms a layer that is hardenable via curing. By controlling the viscosity and volume of the adhesive liquid 810" dispensed, the thickness of the adhesive layer 810 is controlled. In one embodiment, the wafer 800 is spun to more evenly distribute the liquid adhesive 810". The wafer 800 emerges with a uniform adhesive layer 810 covering the entire active side 802.

To protect the back side 804 of the wafer 800, the latter is, in one embodiment, flipped and a protective coating 814 applied to the back side 804. In one embodiment, the protective coating 814 comprises a film 814' that bonds to the wafer 800. In another embodiment, the protective coating 814 comprises a fluid 814" applied wet via another dispensing apparatus 816 and evenly distributed over the back side 804 (while the apparatus 816 is shown diagrammatically beneath the wafer 800, it would actually be oriented above the wafer during dispensing).

Once the adhesive layer 810 is applied, it is—in one embodiment—cured to securely bond it to the wafer 800. Curing may occur via the application of energy such as heat, light, or radiation (as shown by an energy source 818 in FIG. 8D).

Figure 8F:
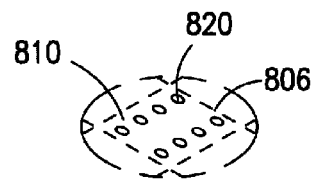
Figure 8E:
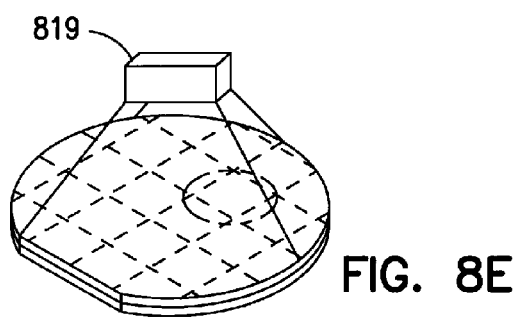

Once cured, the adhesive layer 810 is locally removed, as diagrammatically represented in FIG. 8E, from the area of each pad 808 (see FIG. 8B). In other words, openings 820 are created in the adhesive layer 810, the openings 820 providing access to the pads 808 on each die 806 as generally shown in FIG. 8F. In one embodiment, the openings 820 are formed by providing a photo-sensitive adhesive layer 810. By masking the appropriate areas of the adhesive layer 810 and exposing the latter to an energy source 819, such as a high intensity ultra-violet light source, as shown in FIG. 8E, the adhesive layer 810 is chemically altered in the area of the openings 820. The alteration permits the areas to be selectively etched and removed to form the openings 820. Other methods of forming the openings 820 are also possible.

To accurately locate the openings, one or more datums (not shown) are precisely located on the wafer surface. The adhesive layer is chemically or manually removed (in the vicinity of these datums) to expose the datums. The masking apparatus then uses these datums to ensure accurate alignment of the openings 820 with the pads 808. Other methods of aligning the openings 820 are also possible within the scope of the invention.

Figure 8G:
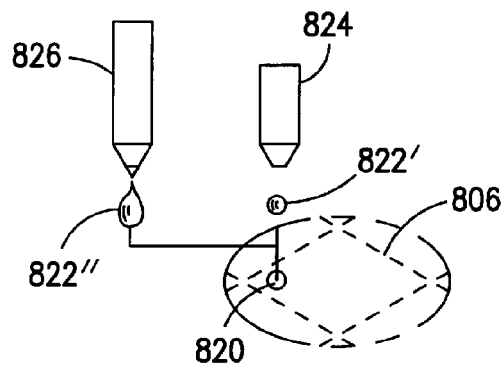

Once the openings 820 are formed, a solder element 822 is inserted therein. In one embodiment, the solder element comprises a solder ball 822' as shown in FIG. 8G. A solder ball 822' is placed into each opening 820 with the use of an apparatus 824 such as a pick-and-place machine (hereinafter PNP). The PNP picks up the solder ball 822' and precisely places it into each opening 820. To form a solder column, multiple balls 822' may be stacked in each opening 820 or, alternatively, the PNP is used to place a column of conductive material. The apparatus 824 is, in another embodiment, a machine similar to the PNP but able to forcefully eject the solder ball 822' into each opening 820. The latter apparatus is advantageous when the solder ball 822' is slightly larger than the opening 820 diameter.

Figure 5:
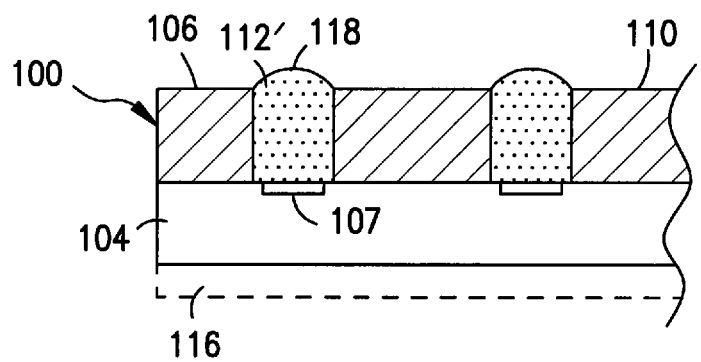
FIG. 5 is another section view taken along line 4-4 of FIG. 3 illustrating another embodiment (some section lines removed for clarity)

In still yet another embodiment, a paste or gel-like conductive material 822" is placed into each opening 820 to form solder columns such as columns 112 in FIGS. 4-6. The material 822" is dispensed directly into the openings 820 with a dispensing apparatus 826 or, alternatively, applied using stencil/screen techniques (not shown).

Still other embodiments are possible for securing the adhesive layer and forming the conductive element. For instance, in the case of a wet adhesive layer, the material is a combination of underfill, conductive fillers, and flux components that are spin-coated or stenciled over the wafer. The conductive fillers migrate through the liquid adhesive and accumulate at the connection pads via application of electro-magnetic or mechanical energy. This yields a wafer 800 having the required conductive elements without requiring explicit forming of the openings 820.

While the embodiments described above form the openings 820 and locate the solder elements 822 after the adhesive layer 810 is attach to the wafer 800, another embodiment of the present invention pre-assembles the adhesive layer 810 and solder elements 822. That is, the openings 820 are formed and the solder elements 822 are placed in the adhesive layer 810 prior to assembly with the wafer 800. For example, in one embodiment, the adhesive layer 810 is a film-like adhesive layer 810' similar to that shown in FIG. 8C. The openings 820 are formed via laser cutting, chemical etching, die cutting or other methods. The solder elements 822 are then inserted by any of the methods described above. At this point, the adhesive layer 810' with the pre-assembled solder elements 822 is secured to the wafer 800. To minimize deformation prior to applying the adhesive layer 810', a removable backing (not shown) may be included with the layer. The removable backing is then removed once the layer 810' is secured.

While not shown in the figures, another embodiment of the present invention secures the solder elements 822 to the wafer prior to application of the adhesive layer. For example, a PNP is used to place a solder ball 822' on each connection pad 808. After placing the solder balls 822, the fluid adhesive 810" is applied. By controlling the volume of the adhesive applied, the thickness of the adhesive layer 810 is controlled relative to the size of the solder balls 822'. Accordingly, the order in which the adhesive layer and solder elements are assembled is not perceived to be critical.

Figure 8H:
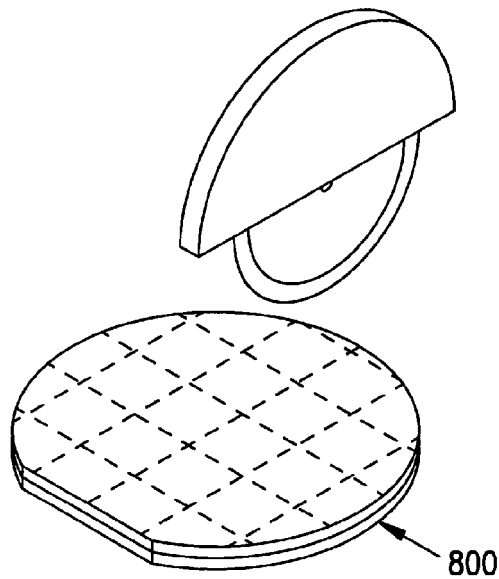
Figure 8I:
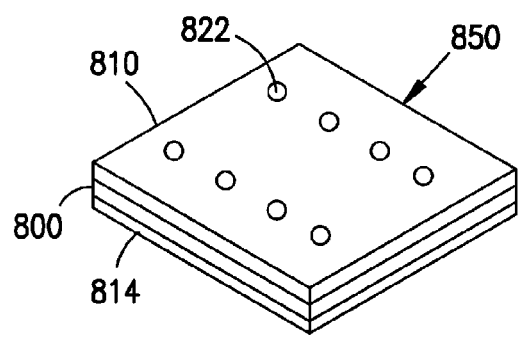

Once the solder elements 822 are positioned and retained within the adhesive layer 810 and the adhesive layer is secured to the wafer 800, the wafer is singulated into individual dice 806 by sawing as shown in FIG. 8H. Once singulated, each individual die 806 with the now integral portion of the adhesive layer 810 and the plurality of solder elements 822 forms a pre-packaged flip chip 850 as shown in FIG. 8I in accordance with the one embodiment. The pre-packaged flip chip 850 is then attached to a support 102 such as a motherboard (see FIG. 2) where it is, if necessary, reflowed to electrically couple and secure it thereto.

Accordingly, various embodiments provide semiconductor device packages and methods for making semiconductor device packages that are accomplished at wafer level. While the packaged device and method are useful for packaging single chips, it is perceived to be particularly advantageous for accommodating multiple, stacked devices as further described below, allowing even greater chip mounting densities.

Figure 9:
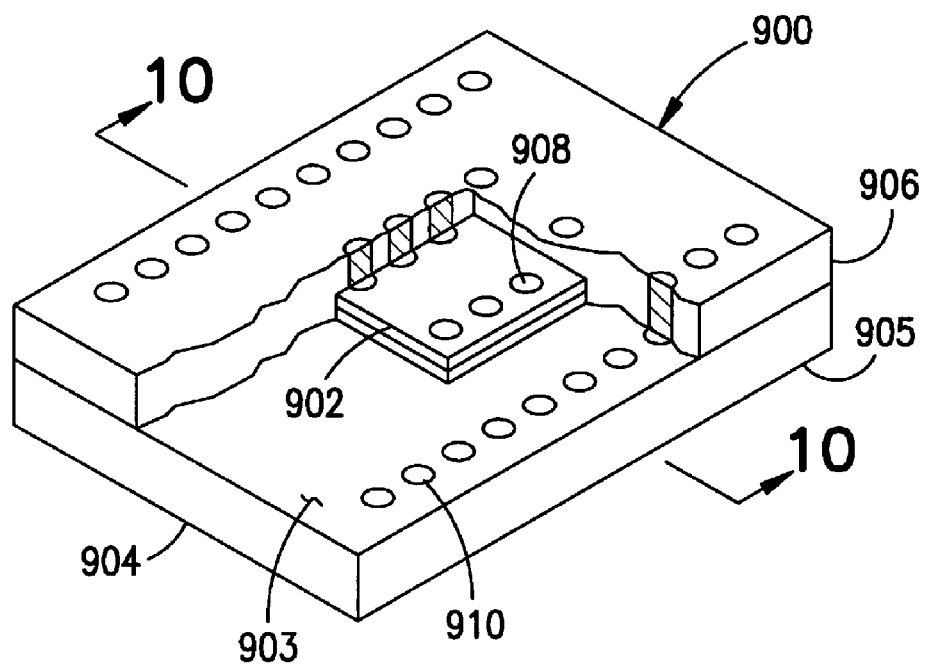
FIG. 9 is a partial cut-away perspective view of a pre-packaged flip chip in accordance with another embodiment (some section lines removed for clarity)
Figure 10:
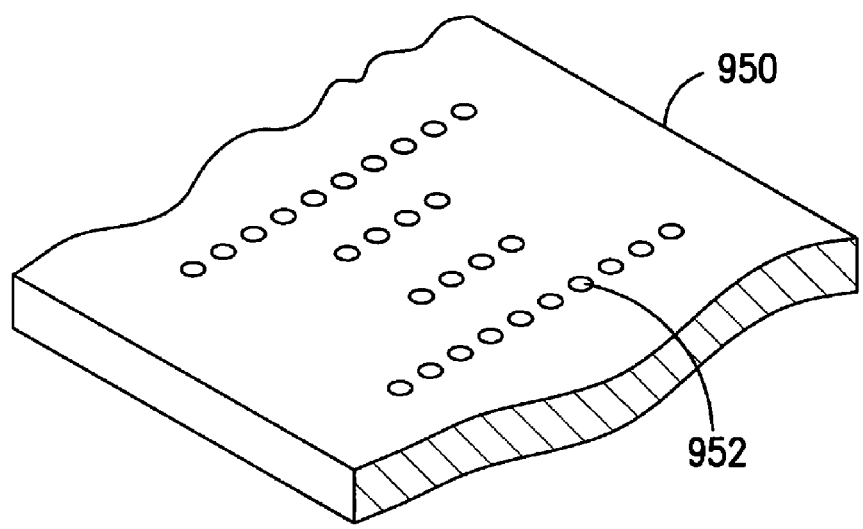
FIG. 10 is a perspective view of a substrate for receiving the pre-packaged flip chip of FIG. 9.

One exemplary embodiment of such a pre-packaged multi-flip chip is shown in FIG. 9. Here, a first semiconductor device comprising a die 902 is attached to an active side 903 of a second, larger semiconductor device comprising a die 904 over which a flip chip adhesive layer 906 is applied to produce a pre-packaged, multi-flip chip 900. The multi-flip chip 900, like the flip chip 100 illustrated in FIG. 3, is adapted for mounting to a receiving support 950 having an array of conductors 952 as shown in FIG. 10.

The first die 902 (see FIG. 9) includes a first array of connection pads 908 while the second die 904 includes a second array of connection pads 910 located along the perimeter of the first die 902. The second die 904 is sized so that when the first die 902 is secured thereto, the pads 910 are still accessible.

Figure 11:
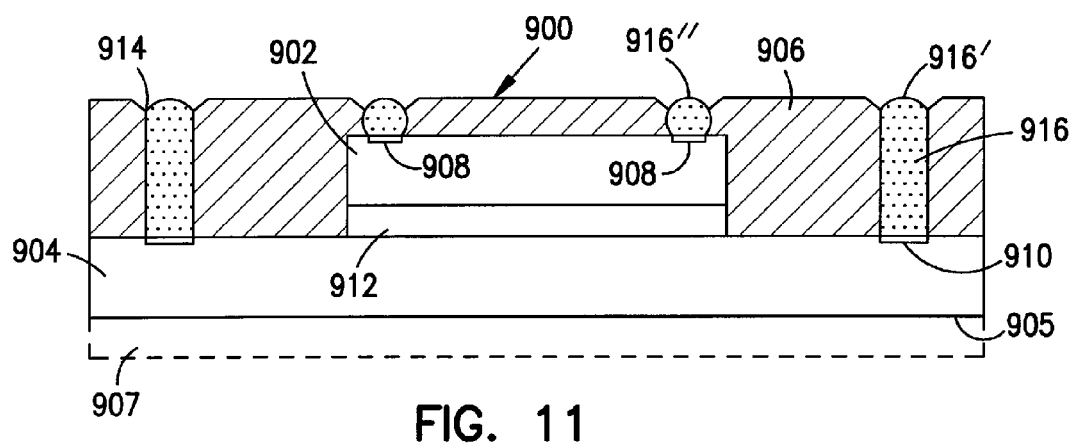
FIG. 11 is a section view taken along line 10-10 of FIG. 9 illustrating one embodiment of the flip chip of FIG. 9 (some section lines removed for clarity)

FIG. 11 shows an exemplary embodiment of the package 900 in cross section. The first die 902 is precisely secured to the second die 904 with a bonding material 912. The adhesive layer 906 is then placed over the combined dice 902, 904 according to any of the methods already described above. The adhesive layer is sufficiently thick to ensure that adequate adhesive layer thickness exists over the first die 902. Like the embodiments described above, the package 900, in one embodiment, includes a protective covering 907 over a back side 905 to protect the package 900 during and after processing.

Figure 12:
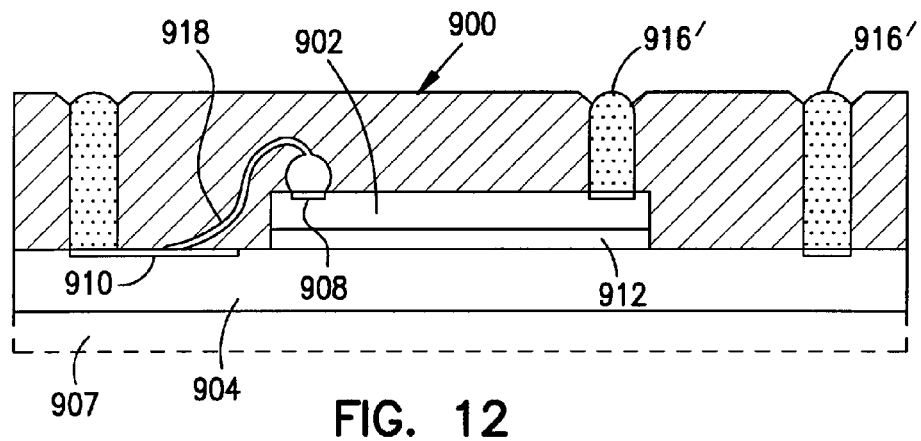
FIG. 12 is another section view taken along line 10-10 of FIG. 9 illustrating another embodiment of the flip chip of FIG. 9 (some section lines removed for clarity)

As with the embodiments already described herein, the adhesive layer 906 is processed to produce an array of openings 914 which are generally aligned with the pads 908 and 910. Within each opening 914 is a solder element 916. The particular shape of the solder elements 916 is varied to accommodate the particular application. For instance, in the embodiment illustrated in FIG. 11, the first array of pads 908 utilize solder balls 916" while the second array of pads 910 utilize solder columns 916'. In FIG. 12, on the other hand, the first array of pads 908 also utilize a solder column 916'. In this particular embodiment, the first die 902 has one or more pads 908 connected directly to the second die 904 by a wire bond 918 or similar connection. This allows interconnection between the circuits on the dice 902, 904 within the package 900.

The multi-chip, flip chip package 900 provides increased circuit densities by stacking multiple dice in a single package. Thus, the package occupies less surface area than singularly packaged die and further permits electrical interconnection of the dice within the package, permitting the use of less complex supports 950 (see FIG. 10); i.e., the support needs no conductive trace to interconnect the various conductive pads.

Figure 13E:
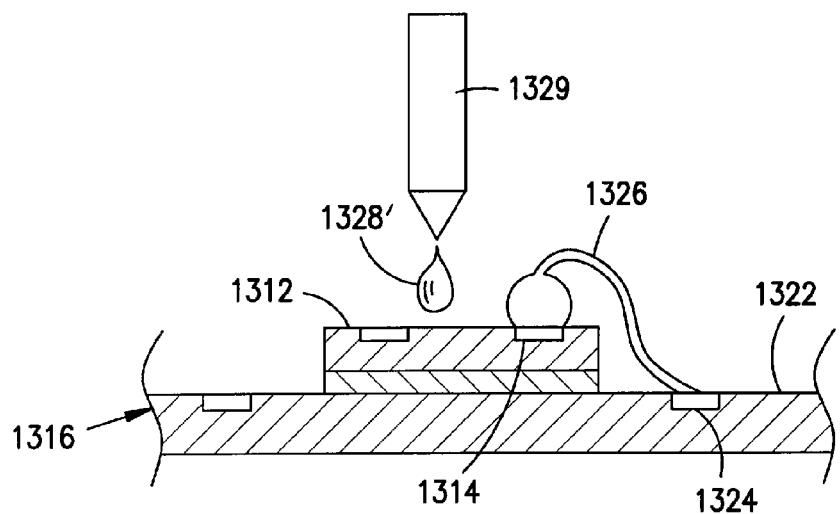

Having described a multi-chip flip chip package according to one embodiment, an exemplary method of making the multi-chip package will now be described with reference to FIGS. 13A-13K. A first wafer 1300 having a first or active side 1302 and a second or back side 1304 is shown in FIG. 13A. A bonding material 1310' is applied to the back side 1304 with a dispensing apparatus 1308 to produce a bonding layer 1310 (see FIG. 13B). The bonding layer 1310 may alternatively be applied in the form of a tape or film (not shown). Once the bonding layer 1310 is formed, the first wafer 1300 is diced as shown in FIG. 13B, producing numerous first dice 1312 as shown in FIG. 13C. Each die 1312 has an array of connection pads 1314 which permit electrical connection to the circuits on the first die 1312.

The first die 1312 is then secured to a second wafer 1316 as shown in FIG. 13D. The second wafer also has a first or active side 1318 and a second or back side 1320 and numerous, larger second dice 1322 thereon. The bonding layer 1310 permits the back side 1304 of each first die 1312 to be secured to the active side 1318 of each second die 1322. In one embodiment, the bonding layer 1310 is a pressure-sensitive material that permits attachment of the dice by application of pressure. In an alternative embodiment, the bonding layer is a heat-sensitive material (i.e., thermoplastic or thermoset) that bonds to the second die 1322 upon application of heat.

After securing the first die 1312 to the second die 1322, the pads 1314 of the first die 1312 are in close proximity and adjacent to pads 1324 of the second die 1322. As such, the pads 1314 and 1324 may be interconnected as shown in FIG. 13E with a wire bond 1326 or similar connection. After interconnection, an adhesive material 1328' is applied to the active side 1318 of the second wafer 1316 with a dispensing apparatus 1329 forming an adhesive layer 1328 as shown in FIG. 13F.

Figure 13F:
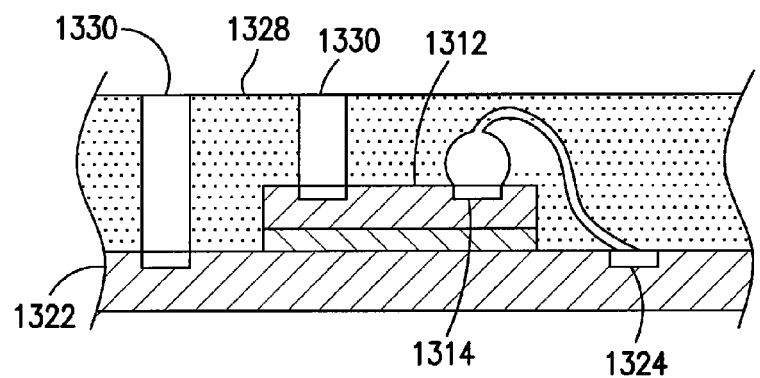

Openings 1330 are then formed within the adhesive layer 1328 as also shown in FIG. 13F. As with the embodiments already described herein, the openings 1330 are substantially aligned with the pads 1324 and 1314 to allow access thereto. The openings may be laser cut, chemically etched, or formed in any one of a variety of ways discussed herein with reference to FIGS. 8A-8I.

Figure 13G:
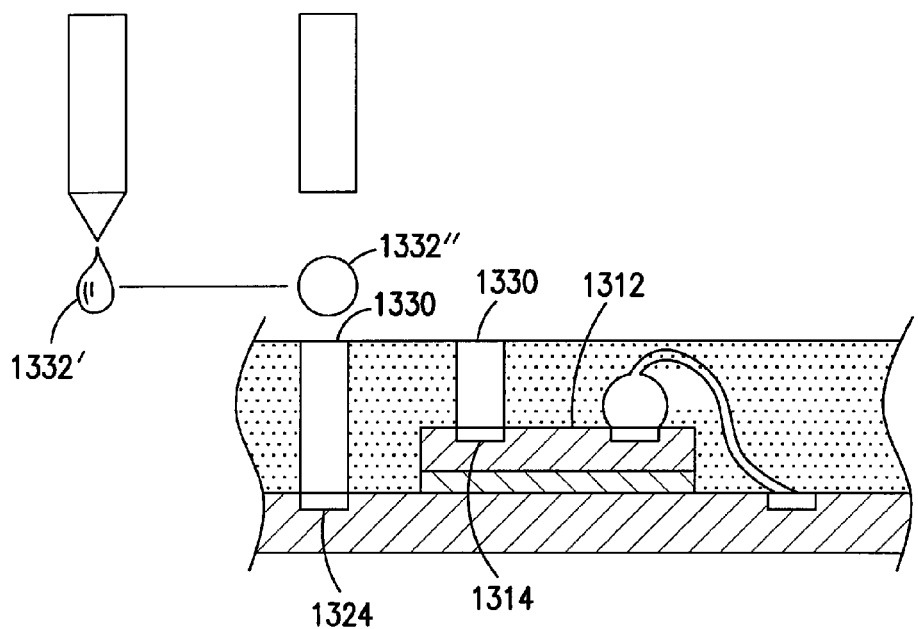
Figure 13H:
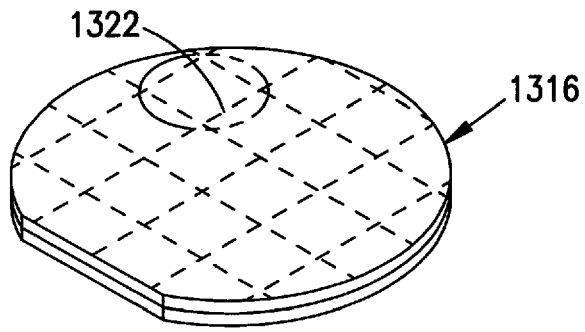
Figure 13I:
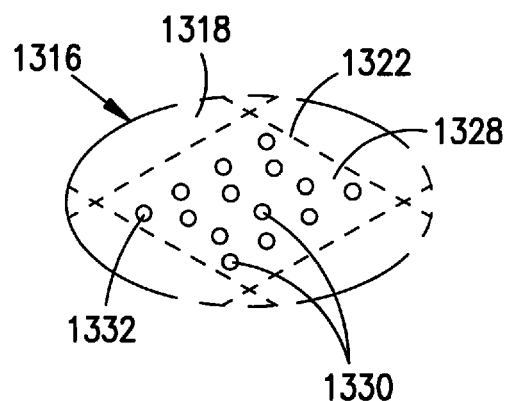
Figure 13J:
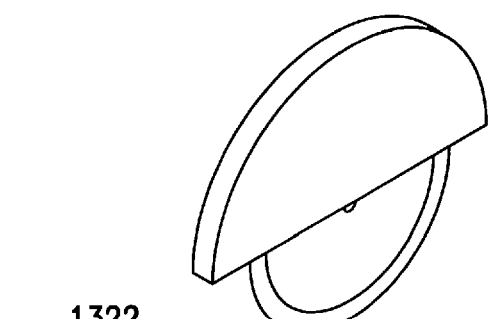
Figure 13J:
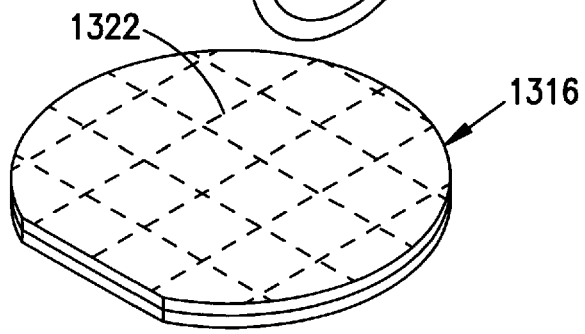
Figure 13K:
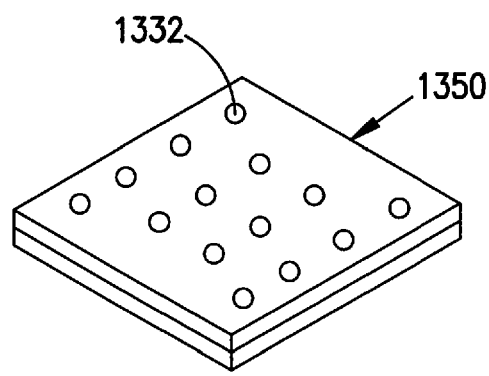

Once the openings 1330 are formed, a solder element 1332 is placed therein as shown in FIG. 13G. In one embodiment, the solder element is a conductive paste material 1332'. In another embodiment, the solder material is a solder ball 1332". The resulting wafer 1316, as shown in FIG. 13H, has numerous second dice 1322 thereon. Each die 1322 has solder elements 1332 retained within the adhesive layer 1328 formed on the active side 1318 of the second wafer 1316 as shown in FIG. 13I. By then dicing the second wafer 1316 along the scribe lines as shown in FIG. 13J, numerous individual multi-chip flip chip packages 1350 as shown in FIG. 13K are produced.

Thus, various embodiments can be utilized to package multiple dice at wafer level. By providing multiple dice in one package, higher mounting densities can be achieved. Furthermore, interconnection between multiple dice can be accommodated within the package rather than via the receiving support.

Figure 14:
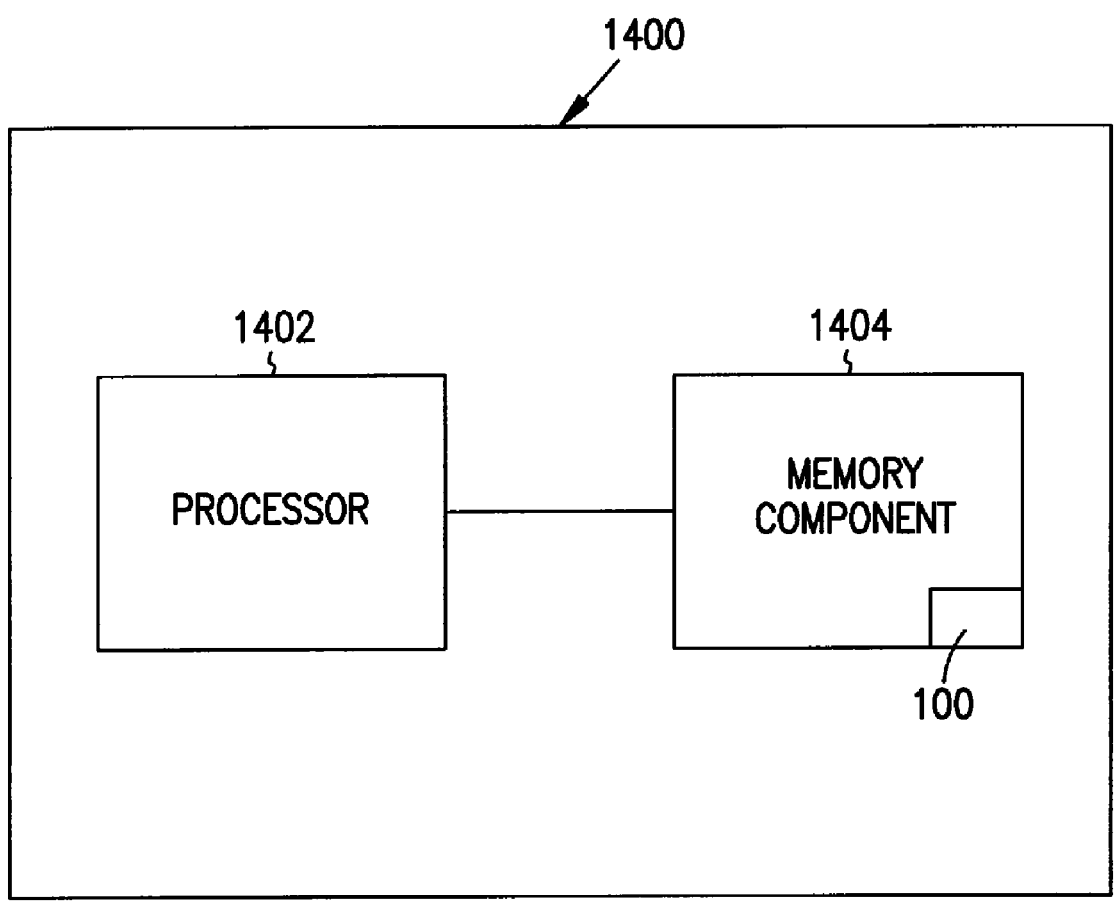
FIG. 14 illustrates an electronic system incorporating the pre-packaged flip chip in accordance with one embodiment.

FIG. 14 illustrates the pre-packaged flip chip 100 according to one embodiment shown as part of an electronic system 1400 such as a computer. The system 1400, in one embodiment, includes a processor 1402 and an electronic apparatus such as a pre-packaged flip chip 100. While diagrammatically depicted as pre-packaged flip chip 100, other embodiments of the memory component 1404 utilize other flip chips (e.g., flip chip package 850, 900, or 1350) described herein. In addition, the flip chip package is not limited to use with memory components but rather is adapted for use with most any semiconductor device application.

Advantageously, the packages and methods of the various embodiments avoid time-consuming underfill operations by prepackaging a die or dice at wafer level. By packaging the die at wafer level, greater manufacturing efficiencies are obtainable due to simultaneous processing of multiple dice across the entire wafer face. In addition, the various embodiments are also particularly amenable to pre-packaging multiple chips in a single module, permitting semiconductor packages having increased electronic densities. Since these multi-chip modules can also be packaged at wafer level, similar manufacturing economies are realized.

Preferred embodiments of the present invention are described above. Those skilled in the art will recognize that many embodiments are possible within the scope of the invention. Variations, modifications, and combinations of the various parts and assemblies can certainly be made and still fall within the scope of the invention. Thus, the invention is limited only by the following claims, and equivalents thereto.

What is claimed is:

1. A method of packaging, comprising:
applying an adhesive to a first side of a finished wafer, the first side comprising an array of dice;
processing the adhesive to create an array of openings therein, the array of openings including a chamfered edge having a bevel extending into the opening and providing access to an array of connection pads on each die of the array of dice;
substantially filling the array of openings with an electrically conductive material; and
singulating each die from the array of dice, wherein each die, combined with the adhesive and electrically conductive material, forms an individual flip chip package.

2. The method of claim 1, wherein the method is performed in the order presented.

3. The method of claim 1, wherein substantially filling the array of openings further comprises placing at least one solder ball therein.

4. The method of claim 1, wherein substantially filling the array of openings further comprises forming a solder ball therein.

5. The method of claim 1, wherein substantially filling the array of openings further comprises dispensing a conductive paste therein.

6. A method of packaging, comprising:
attaching a second side of a first die to a first side of a second die, the first side of the second die located on a first side of a finished wafer, such that a first array of connection pads located on a first side of the first die is adjacent to a second array of connection pads located on the first side of the second die;
applying an adhesive layer over the first side of the first die and the first side of the second die; and
forming an array of conductive elements within the adhesive layer, the array of conductive elements having at least one convex-shaped head, wherein the conductive elements are electrically coupled to at least one of the first array of connection pads and the second array of connection pads, and wherein the adhesive layer has a chamfer in a vicinity of each connection pad of the first and second array of connection pads wherein each of the chamfer includes an edge having a bevel extending into a side of the conductive element.

7. The method of claim 6, wherein applying an adhesive layer further comprises distributing a fluid material over the first side of the first die and the first side of the second die, the fluid material forming a hardenable layer.

8. The method of claim 6, further comprising electrically interconnecting at least one connection pad of the first array of connection pads to at least one connection pad of the second array of connection pads prior to applying the adhesive layer.

9. The method of claim 6, further comprising creating an array of openings in the adhesive layer, the array of openings substantially aligned with one or more connection pads of the first array of connection pads and the second array of connection pads.

10. The method of claim 9, further comprising depositing a conductive material into the array of openings.

11. The method of claim 6, wherein the method is performed in the order presented.

12. A method of packaging, comprising:
singulating a first die from a first wafer where the first wafer comprises a plurality of first dice, wherein the first die has a first side and a second side;
attaching the second side of the first die to a first side of a second die, the second die forming a portion of a second wafer where the second wafer is a finished wafer having a plurality of second dice, the second die being larger than the first die;
applying an adhesive to the second wafer, the adhesive substantially covering the first side of both the first die and the second die;
processing the adhesive to create an array of openings therein, the array of openings including a chamfer having a bevel extending into the opening and providing access to an array of connection pads on each of the first die and the second die; and
substantially filling the array of openings with an electrically conductive material.

13. The method of claim 12, further comprising singulating the second die from the second wafer, the singulated second die with the attached first die, the adhesive, and the electrically conductive material forming an individual multi-chip, flip-chip package.

14. The method of claim 12, further comprising applying a protective coating to a second side of the second wafer.

15. The method of claim 12, further comprising applying a bonding material to the second side of the first wafer, the bonding material being operable to permit attaching the first die to the second die.

16. The method of claim 12, wherein the method is performed in the order presented.

17. A method of packaging, comprising:
providing a finished wafer having one or more dice, each die including an active side with an array of connection pads, the active side disposed on a first side of the finished wafer;
applying a protective coating to a backside of the finished wafer, the backside being opposite the first side of the finished wafer;
applying an adhesive layer to the first side of the finished wafer, the adhesive layer substantially covering the active side of a first die of the one or more dice of the finished wafer;
curing the adhesive layer;
processing the adhesive layer to create an array of chamfered openings, wherein the chamfered openings include a bevel extending into the chamfered opening, the array of openings providing access to the array of connection pads of the first die of the finished wafer;
substantially filling the array of openings with an electrically conductive material to electrically contact the array of connection pads; and
singulating the first die from the finished wafer.

18. The method of claim 17, wherein applying an adhesive layer further comprises applying a fluid adhesive layer.

19. The method of claim 17, wherein curing the adhesive layer further comprises curing a fluid adhesive layer.

20. The method of claim 17, wherein applying a protective coating to a backside of the finished wafer further comprises applying an epoxy compound to the backside of the finished wafer.

21. The method of claim 17, wherein processing the adhesive layer to create an array of openings further comprises:
masking areas of the adhesive layer, wherein the adhesive layer is a photo-sensitive adhesive layer;

exposing the photo-sensitive adhesive layer to an energy source; and etching the photo-sensitive adhesive layer to form the array of openings.

22. The method of claim 17, wherein substantially filling the array of openings with an electrically conductive material further comprises placing a solder ball in each opening of the array of openings.

23. A method of packaging, comprising:
providing a first die, the first die having an active side and a back side, the active side having a first array of connection pads;
providing a finished wafer having one or more dice, each die including an active side with an array of connection pads, the active side disposed on a first side of the finished wafer;
securing the first die to a second die on the finished wafer, the second die being one of the one or more dice of the finished wafer, such that the first array of connection pads located on the active side of the first die is accessible and a second array of electrical connection pads located on the active side of the second die is accessible;
interconnecting one or more connection pads of the second array of connection pads;
applying an adhesive layer to the first side of both the first die and the second die;
processing the adhesive layer to create an array of chamfered openings, wherein the chamfered openings include a bevel extending into the chamfered opening, the array of openings providing access to at least one of the first array of connection pads and the second array of connection pads;
substantially filling the array of openings with an electrically conductive material to electrically contact at least one of the first array of connection pads and the second array of connection pads; and
singulating the second die from the finished wafer with the first die secured to the second die.

24. The method of claim 23, wherein providing a first die further comprises:
providing a first wafer including one or more dice, the first wafer further including an active side and a back side;
producing a bonding layer on the back side of the first wafer;
dicing the first wafer to provide the first die with a bonding layer on its back side.

25. The method of claim 24, wherein securing the first die to a second die further comprises attaching the back side of the first die to the active side of the second die using the bonding layer.

26. The method of claim 25, wherein attaching the back side of the first die to the active side of the second die using the bonding layer further comprises using a pressure sensitive material as the bonding layer to attach the back side of the first die to the active side of the second die.

27. The method of claim 25, wherein attaching the back side of the first die to the active side of the second die using the bonding layer further comprises using a heat sensitive and pressure sensitive material as the bonding layer to bond the back side of the first die to the active side of the second die.

28. The method of claim 23, wherein applying an adhesive layer further comprises applying a fluid adhesive layer.

29. The method of claim 23, further comprising curing the adhesive layer.

30. The method of claim 23, further comprising applying a protective coating to a back side of the finished wafer.

31. The method of claim 23, wherein processing the adhesive layer to create an array of openings further comprises:
masking areas of the adhesive layer, wherein the adhesive layer is a photo sensitive adhesive layer;
exposing the photo sensitive adhesive layer to an energy source; and etching the photo sensitive adhesive layer to form the array of openings.

32. The method of claim 23, wherein substantially filling the array of openings with an electrically conductive material further comprises placing a solder ball in each opening of the array of openings.

33. The method of claim 23, wherein substantially filling the array of openings with an electrically conductive material further comprises placing at least one of a conductive paste and a conductive gel in each opening of the array of openings forming an array of solder columns.

34. The method of claim 23, further comprising:
securing a plurality of the first die to a plurality of second die; and
dicing the finished wafer to generate a plurality of individual multi-chip packages.

35. The method of claim 34, further comprising dicing the finished wafer to generate a plurality of individual multi-chip packages that include more than two dice.

36. A method, comprising:
providing a semiconductor wafer that includes a plurality of semiconductor devices formed thereon, each of the plurality of semiconductor devices including connection pads exposed on at least one side of the wafer;
applying an adhesive layer to the at least one side of the wafer having the exposed connection pads;
processing the adhesive layer to generate chamfered openings in the layer coincident with the connection pads, wherein the chamfered openings include a bevel extending into the chamfered opening;
applying an electrically conductive material to at least a portion of the generated openings; and
separating the plurality of semiconductor devices from the semiconductor wafer.

37. The method of claim 36, wherein applying an adhesive layer further comprises disposing a fluid elastomeric material to the at least one side of the wafer having the exposed connection pads.

38. The method of claim 36, wherein applying an adhesive layer further comprises disposing a dry adhesive film on the at least one side of the wafer having the exposed connection pads.

39. The method of claim 38, wherein disposing a dry adhesive film on the at least one side of the wafer having the exposed connection pads further comprises disposing a pressure sensitive film to the at least one side of the wafer having the exposed connection pads.

40. The method of claim 36, wherein processing the adhesive layer further comprises curing the adhesive layer.

41. The method of claim 40, wherein curing the adhesive layer further comprises curing the adhesive layer by exposing the adhesive layer to at least one of a heat source, a source of electromagnetic radiation and a source of ionizing radiation.

42. The method of claim 36, wherein processing the adhesive layer to generate openings in the layer further comprises forming the openings using photolithography.

43. The method of claim 36, wherein processing the adhesive layer to generate openings in the layer further comprises forming the openings using one of photetching the openings, laser cutting the openings, and die cutting the openings.

44. The method of claim 36, wherein applying an electrically conductive material further comprises positioning a solder element into at least a portion of openings in the adhesive layer.

45. The method of claim 44, wherein positioning a solder element into at least a portion of openings further comprises positioning a spherically-shaped solder element into at least a portion of openings in the adhesive layer.

46. The method of claim 44, wherein positioning a solder element into at least a portion of openings further comprises positioning a cylindrically-shaped solder element into at least a portion of openings in the adhesive layer.

47. The method of claim 44, wherein positioning a solder element into at least a portion of openings in the adhesive layer further comprises depositing a flux into the openings that receive a solder element.

48. The method of claim 36, wherein applying an electrically conductive material further comprises positioning a conductive polymer into at least a portion of openings in the adhesive layer.

49. The method of claim 36, wherein applying an electrically conductive material further comprises positioning a conductive paste into at least a portion of openings in the adhesive layer.

50. The method of claim 36, further comprising forming one or more datum locations on the semiconductor wafer that are suitably positioned to permit alignment of the wafer with a photolithographic mask.

51. The method of claim 36, wherein separating the plurality of semiconductor devices from the semiconductor wafer further comprises dicing the semiconductor wafer to separate the devices.

* * * * *

UNITED STATES PATENT AND TRADEMARK OFFICE
CERTIFICATE OF CORRECTION

| | | |
|---|---|---|
| PATENT NO. | : 7,943,422 B2 | Page 1 of 1 |
| APPLICATION NO. | : 11/460089 | |
| DATED | : May 17, 2011 | |
| INVENTOR(S) | : Suan Jeung Boon | |

It is certified that error appears in the above-identified patent and that said Letters Patent is hereby corrected as shown below:

In column 11, line 47, in Claim 6, after "pads" insert -- ; --.

Signed and Sealed this
Twelfth Day of July, 2011

David J. Kappos
*Director of the United States Patent and Trademark Office*